(12) United States Patent
Ong

(10) Patent No.: US 6,943,556 B2
(45) Date of Patent: Sep. 13, 2005

(54) HIGH-SPEED DUTY CYCLE TEST THROUGH DC MEASUREMENT USING A COMBINATION OF RELAYS

(75) Inventor: Shao Chee Ong, Penang (MY)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 10/609,516

(22) Filed: Jun. 30, 2003

(65) Prior Publication Data

US 2004/0263184 A1 Dec. 30, 2004

(51) Int. Cl.[7] .......................... G01R 31/08; H03K 3/017
(52) U.S. Cl. .................................. 324/527; 327/175
(58) Field of Search ................. 324/527, 532, 324/537, 753, 750, 755, 759, 761–764; 327/35, 172, 173, 174, 175; 331/175

(56) References Cited

U.S. PATENT DOCUMENTS

| 5,323,483 | A | * | 6/1994 | Baeg | 388/811 |
|---|---|---|---|---|---|
| 5,481,228 | A | * | 1/1996 | Badyal | 331/74 |
| 5,559,685 | A | * | 9/1996 | Lauw et al. | 363/37 |
| 5,777,500 | A | * | 7/1998 | Eitrheim | 327/174 |
| 6,084,451 | A | * | 7/2000 | Choi et al. | 327/172 |
| 6,275,962 | B1 | * | 8/2001 | Fuller et al. | 714/724 |
| 6,316,926 | B1 | * | 11/2001 | Savo et al. | 323/282 |
| 6,396,506 | B1 | * | 5/2002 | Hoshino et al. | 345/650 |
| 6,441,600 | B1 | * | 8/2002 | Atallah et al. | 324/76.11 |
| 2004/0008043 | A1 | * | 1/2004 | Thomas et al. | 324/715 |

* cited by examiner

*Primary Examiner*—Vincent Q. Nguyen
*Assistant Examiner*—Jeff Natalini
(74) *Attorney, Agent, or Firm*—Blakely, Sokoloff, Taylor & Zafman LLP

(57) ABSTRACT

According to one embodiment of the present invention, a method of high-speed duty cycle test through DC measurement using a combination of relays. The method includes: providing a plurality of relays to generate one or more duty cycle control signals; providing the duty cycle control signals to a device under test; measuring a first DC portion of a first output signal of the device under test; and dividing the first DC portion by a sum of the first DC portion and a second DC portion of a second output signal of the device under test.

30 Claims, 3 Drawing Sheets

HIGH-SPEED DUTY CYCLE TEST THROUGH DC MEASUREMENT USING A COMBINATION OF RELAYS

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention generally relates to the field of testing electrical characteristics. More particularly, an embodiment of the present invention relates to high-speed duty cycle testing through direct current (DC) measurement using a combination of relays.

BACKGROUND

As the use of electronic equipment in everyday life becomes more commonplace, higher speed electronic devices become more desirable. Circuits are at the heart of electronic devices. Generally, to speed up a circuit, the speed of the signals (or their frequency) is increased. The undesirable affects associated with a signal increase as the frequency of the signal increases.

At high speed, the crossing point of an eye is critical to ensure the integrity of data stream. The ability to adjust the duty cycle/crossing point of an eye allows compensation of high speed circuit characteristic asymmetry.

Since eye crossing-point/duty cycle is critical in the design of high-speed systems, it is of utmost importance to ensure that duty cycle is measured accurately to provide an operating circuit.

Conventional solution for measuring duty cycle (especially, in high-speed differential signal, e.g., at or above 10 Gbps) is typically achieved through a potentiometer residing on an actual application board and use of external instruments such as a digital communication analyzer (DCA) or oscilloscope. This solution can, however, be cumbersome, lengthy, and unfriendly in a high volume-manufacturing (HVM) factory. Moreover, this solution requires use of costly equipment.

Accordingly, the conventional techniques fail to provide a quick, efficient, cost-effective, and user-friendly solution to measure duty cycle, which is quickly becoming a necessity when designing faster circuits.

BRIEF DESCRIPTION OF THE DRAWINGS

The invention is illustrated by way of example and not limitation in the figures of the accompanying drawings, in which like references indicate similar or identical elements, and in which.

DETAILED DESCRIPTION

In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
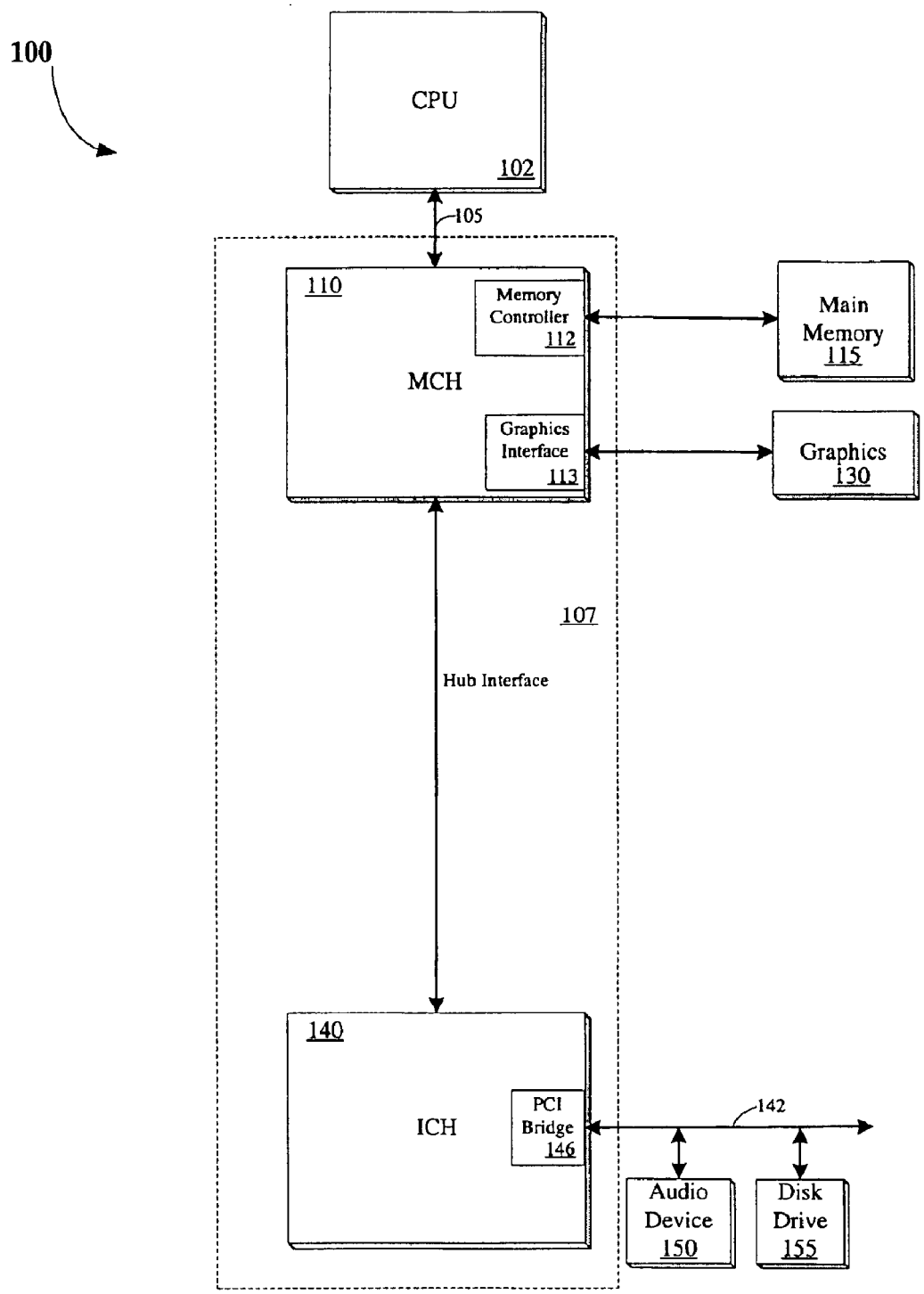
FIG. 1 illustrates an exemplary block diagram of a computer system 100 in accordance with an embodiment of the present invention.

FIG. 1 illustrates an exemplary block diagram of a computer system 100 in accordance with an embodiment of the present invention. The computer system 100 includes a central processing unit (CPU) 102 coupled to a bus 105. In one embodiment, the CPU 102 is a processor in the Pentium® family of processors including the Pentium® II processor family, Pentium® III processors, Pentium® IV processors available from Intel Corporation of Santa Clara, Calif. Alternatively, other CPUs may be used, such as Intel's XScale processor, Intel's Banias Processors, ARM processors available from ARM Ltd. of Cambridge, the United Kingdom, or OMAP processor (an enhanced ARM-based processor) available from Texas Instruments, Inc., of Dallas, Tex.

A chipset 107 is also coupled to the bus 105. The chipset 107 includes a memory control hub (MCH) 110. The MCH 110 may include a memory controller 112 that is coupled to a main system memory 115. Main system memory 115 stores data and sequences of instructions that are executed by the CPU 102 or any other device included in the system 100. In one embodiment, main system memory 115 includes dynamic random access memory (DRAM); however, main system memory 115 may be implemented using other memory types. Additional devices may also be coupled to the bus 105, such as multiple CPUs and/or multiple system memories.

The MCH 110 may also include a graphics interface 113 coupled to a graphics accelerator 130. In one embodiment, graphics interface 113 is coupled to graphics accelerator 130 via an accelerated graphics port (AGP) that operates according to an AGP Specification Revision 2.0 interface developed by Intel Corporation of Santa Clara, Calif. In an embodiment of the present invention, a flat panel display may be coupled to the graphics interface 113 through, for example, a signal converter that translates a digital representation of an image stored in a storage device such as video memory or system memory into display signals that are interpreted and displayed by the flat-panel screen. It is envisioned that the display signals produced by the display device may pass through various control devices before being interpreted by and subsequently displayed on the flat-panel display monitor.

In addition, the hub interface couples the MCH 110 to an input/output control hub (ICH) 140 via a hub interface. The ICH 140 provides an interface to input/output (I/O) devices within the computer system 100. The ICH 140 may be coupled to a Peripheral Component Interconnect (PCI) bus adhering to a Specification Revision 2.1 bus developed by the PCI Special Interest Group of Portland, Oreg. Thus, the ICH 140 includes a PCI bridge 146 that provides an interface to a PCI bus 142. The PCI bridge 146 provides a data path between the CPU 102 and peripheral devices.

The PCI bus 142 includes an audio device 150 and a disk drive 155. However, one of ordinary skill in the art will appreciate that other devices may be coupled to the PCI bus 142. In addition, one of ordinary skill in the art will recognize that the CPU 102 and MCH 110 could be combined to form a single chip. Furthermore, graphics accelerator 130 may be included within MCH 110 in other embodiments.

In addition, other peripherals may also be coupled to the ICH 140 in various embodiments. For example, such peripherals may include integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Moreover, the computer system 100 is envisioned to receive electrical power from one or more of the following sources for its operation: a battery, alternating current (AC) outlet (e.g., through a transformer and/or adaptor), automotive power supplies, airplane power supplies, and the like.

Figure 2:
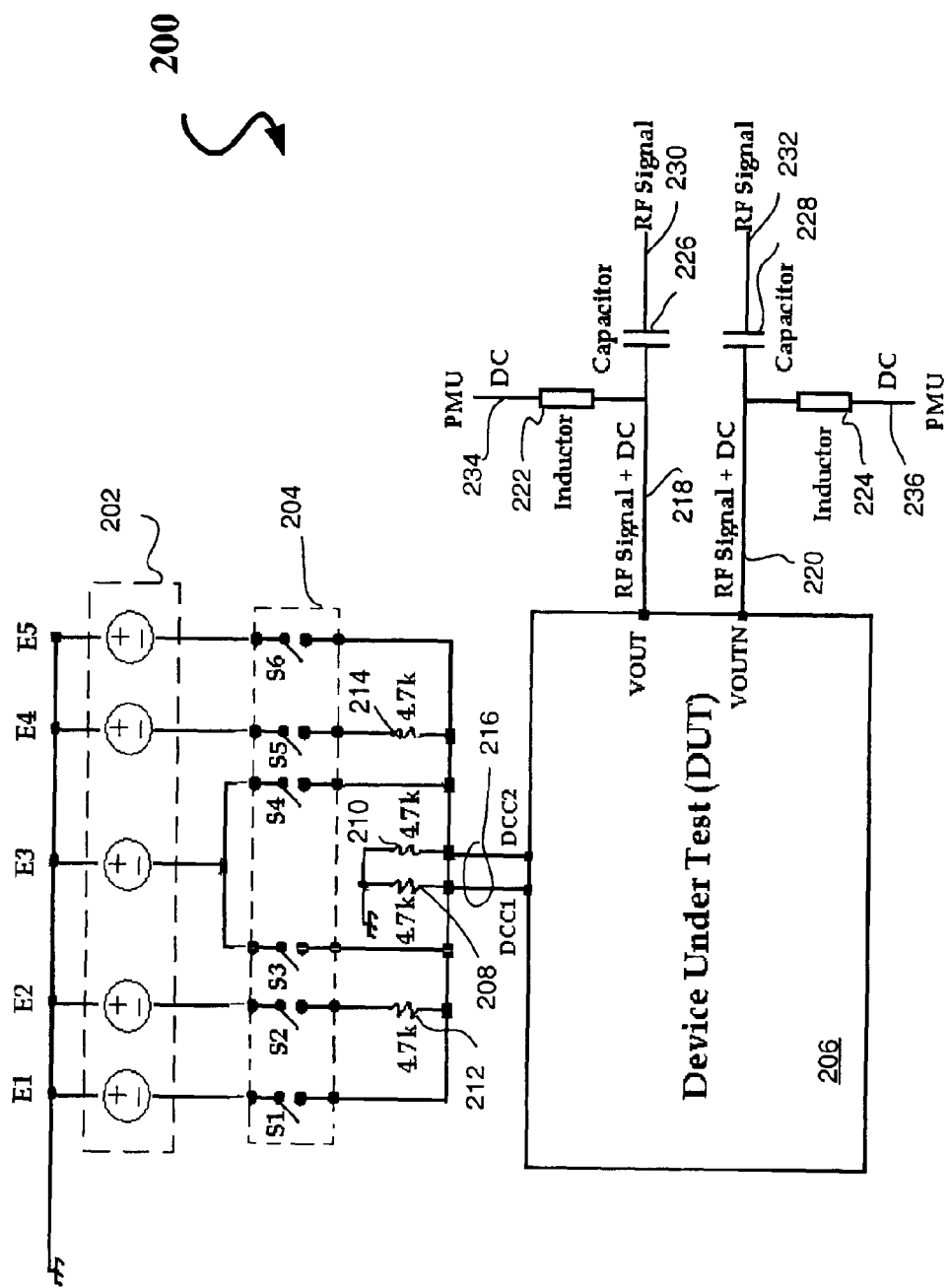
FIG. 2 illustrates an exemplary device 200 in accordance with an embodiment of the present invention.

FIG. 2 illustrates an exemplary device 200 in accordance with an embodiment of the present invention. The device 200 includes a set of voltage sources 202, a set of relays 204, and a device under test (DUT) 206. In one embodiment of the present invention, the device 200 may be utilized to test components of the system 100 of FIG. 1 (e.g., as the device 206). In another embodiment of the present invention, the voltage sources 202 are provided by a parametric measurement unit (PMU).

As illustrated in FIG. 2, the relays 204 may be coupled to ground through resistors (e.g., 208, 210, 212, and 214) and to the device 206 through duty cycle control (DCC) pins 216. In one embodiment of the present invention, the relays 204 (e.g., together with the voltage sources 202) enable changing of the voltages present across DCC pins 216 to manipulate the duty cycle of the device 206. In another embodiment of the present invention, such an approach simulates a potentiometer meter without requiring the presence of the potentiometer, which needs to be on the application board and can be difficult to design on a test interface unit (TIU). In a further embodiment of the present invention, this approach employs relatively low cost relays (which may traditionally reside on an automated test equipment's (ATE's) TIU), utilizing conventional ATE capabilities such as PMU, or otherwise easy to provide.

Table 1 illustrates how the different values applied to the reference nodes (i.e., E1 to E5), together with the state of the relays 204 simulates the function of a potentiometer (i.e., when the potentiometer is left, at the middle, or right). Dashes in Table 1 indicate that the node is left unconnected.

TABLE 1

| Testing Function Simulation | E1 | E2 | E3 | E4 | E5 | S1 | S2 | S3 | S4 | S5 | S6 |
|---|---|---|---|---|---|---|---|---|---|---|---|
| Potentiometer left | 0V | — | — | — | — | on | off | off | off | off | off |
| Potentiometer at the middle | — | 0V | — | 0V | — | off | on | off | off | on | off |
| Potentiometer right | — | — | — | — | 0V | off | off | off | off | off | on |

The output signals from the device 206 (218 and 220) are then provided to a bias-T circuit, which includes the inductors (222 and 224) and capacitors (226 and 228). In one embodiment of the present invention, the output signal 218 is complementary to the output signal 220. In another embodiment of the present invention, the bias-T circuit enables separation of the DC and the radio frequency (RF) signals. Moreover, the capacitors (226 and 228) are envisioned to only allow RF signals to pass to nodes 230 and 232, respectively, and the inductors (222 and 224) are envisioned to only allow the DC signals to pass to the nodes 234 and 236.

In a further embodiment of the present invention, the nodes 234 and 236 are connected to an automated test equipment's (ATE's) PMU for DC measurement. The p channel's DC values (e.g., from node 234) is measured and divided by the sum of the DC value of the p and n channels (e.g., divided by the sum of the DC value of the nodes 234 and 236). In one embodiment of the present invention, the dividing may performed by a computer such as that discussed with respect to FIG. 1, other calculation devices (such as a calculator, a personal digital assistant (PDA), and the like), or manually. Since the DC ratio is a reflection of the actual duty cycle, this method enables the duty cycle to be measured in a fast, test time efficient, and economical way. Furthermore, this method may be easily implemented in a HVM ATE tester without incurring any additional instrument cost (such as external instruments including oscilloscopes or DCAs).

It is envisioned that the value of the resistors (e.g., 208–214), inductors (e.g., 222–224), and capacitors (e.g., 226–228) may be varied according to the application. For example, the 4.7 k resistor value illustrated in FIG. 2 is for a specific laser driver. Similarly, it is envisioned that measuring different frequencies may need a different size inductor that may be set as low as possible to pass the DC signal. Also, in accordance with an embodiment of the present invention, the voltage sources 202 are not part of the TIU and may be external.

Figure 3:
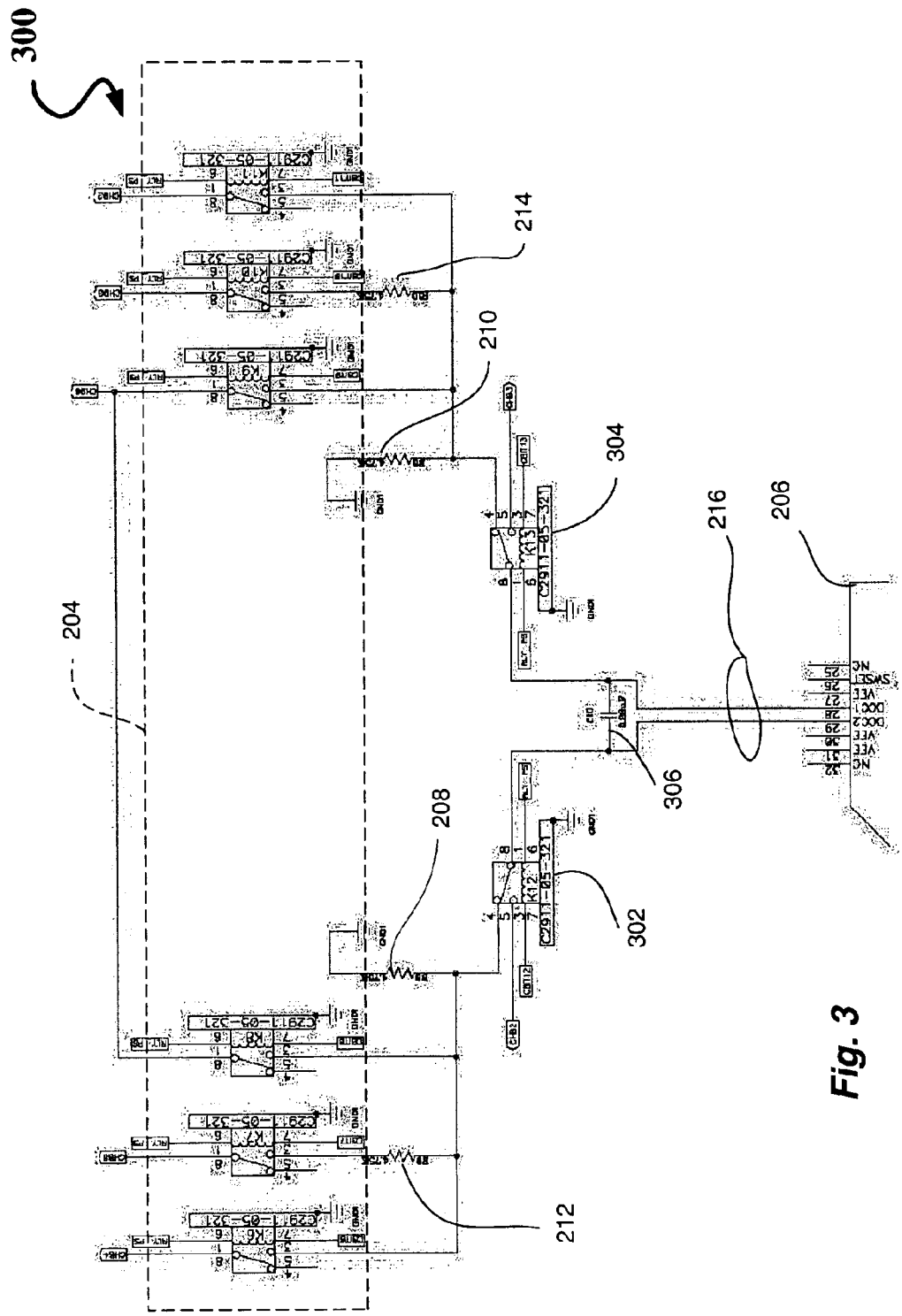
FIG. 3 illustrates an exemplary whole TIU schematic 300 in accordance with an embodiment of the present invention.

FIG. 3 illustrates an exemplary whole TIU schematic 300 in accordance with an embodiment of the present invention. In one embodiment of the present invention, the schematic 300 is the same as or similar to the device 200 (excluding the output stage of the device 206). The schematic 300 illustrates an embodiment utilizing specific part numbers readily available or familiar to those skilled in the art. The schematic 300 illustrates the relays 204, resistors 208–214, the DCC pins 216, and the device 206.

The schematic 300 further illustrates relays 302 and 304 which may be present to route the varying voltages from the relays 204 to the DCC pins 216. The schematic 300 also illustrates a capacitor 306 which may be utilized to filter the signals on the DCC pins 216.

In one embodiment of the present invention, a series of low cost relays (e.g., 204) is constructed to simulate a potentiometer that is typically used in actual application board and difficult to be designed on TIU or controlled by ATE. The combinations of relays that are connected to tester channels at different voltage create different potentials similar to that of an actual potentiometer that will then vary the duty cycle of waveform. The high-speed signal is routed through a bias-T circuit where the DC component is connected to PMU for DC measurement. The p channel's DC values is measured and divided by the sum of the DC value of the p and n channels. Since the DC ratio is a reflection of the actual duty cycle, this embodiment enables the duty cycle to be measured in a test-time efficient way, which can be easily implemented in HVM without incurring any additional instrument cost.

In another embodiment of the present invention, the novel test methodology disclosed herein is envisioned to provide a cost and test-time effective way to measure high speed duty cycle using components and instruments readily available on TIU and ATE tester, without incurring additional external instrument cost such as DCA or oscilloscope.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. A method comprising:
   generating one or more duty cycle control signals by varying one or more voltage values and states of one or more relays receiving the values in order to simulate a potentiometer;
   providing the duty cycle control signals to a device under test;
   separating a first DC portion of a first output signal and a radio frequency (RF) of the first output signal by using a bias-T circuit;
   measuring the first DC portion of the first output signal of the device under test;
   measuring a second DC portion of a second output signal of the device under test; and
   dividing the first DC portion by a sum of the first DC portion and the second DC portion of a second output signal of the device under test.

2. The method of claim 1 wherein a ratio provided by the dividing reflects a duty cycle corresponding to the device under test.

3. The method of claim 1 wherein the second output signal is complementary to the first output signal of the device under test.

4. The method of claim 3 wherein the first output signal is a p channel output signal of the device under test.

5. The method of claim 1 further including providing a plurality of voltage sources coupled to the plurality of relays to drive the duty cycle control signals.

6. The method of claim 1 further including providing a plurality of resistors coupled between the plurality of relays and the device under test to vary a potential driving the duty cycle control signals.

7. The method of claim 1 further including providing a bias-T circuit to extract the first and second DC portions.

8. The method of claim 7 wherein the bias-T circuit includes a first inductor coupled to the first output signal to extract the first DC portion.

9. The method of claim 7 wherein the bias-T circuit includes a second inductor coupled to the second output signal to extract the second DC portion.

10. The method of claim 7 further including coupling the bias-T circuit to a PMU for DC measurement.

11. The method of claim 1 further including providing a plurality of capacitors to pass RF signals corresponding to the first and second output signals.

12. An apparatus comprising:
   a plurality of relays to generate one or more duty cycle control signals by varying one or more voltage values and states of one or more relays receiving the values in order to simulate a potentiometer;
   a device under test coupled to the plurality of relays to receive the duty cycle control signals;
   a bias-T circuit coupled to the device under test to receive a first output signal and a second output signal of the device under test, the bias-T circuit extracting a first DC portion of the first output signal and a second DC portion of the second output signal and bias-T circuit separating the first DC portion of the first output signal and a radio frequency (RF) of the first output signal; and
   a divider to divide a value of the first DC portion by a sum of the first DC portion and the second DC portion.

13. The apparatus of claim 12 wherein a ratio provided by the divider reflects a duty cycle corresponding to the device under test.

14. The apparatus of claim 12 wherein the divider is selected from a group comprising a calculator, a computer, and a PDA.

15. The apparatus of claim 12 wherein the second output signal is complementary to the first output signal of the device under test.

16. The apparatus of claim 15 wherein the first output signal is a p channel output signal of the device under test.

17. The apparatus of claim 12 further including a plurality of voltage sources coupled to the plurality of relays to drive the duty cycle control signals.

18. The apparatus of claim 12 further including a plurality of resistors coupled between the plurality of relays and the device under test to vary a potential driving the duty cycle control signals.

19. The apparatus of claim 12 wherein the bias-T circuit includes a first inductor coupled to the first output signal to extract the first DC portion.

20. The apparatus of claim 12 wherein the bias-T circuit includes a second inductor coupled to the second output signal to extract the second DC portion.

21. The apparatus of claim 12 further including a plurality of capacitors to pass RF signals corresponding to the first and second output signals.

22. The apparatus of claim 12 wherein the first and second DC portions are measured by an ATE.

23. The apparatus of claim 12 wherein the plurality of relays reside on a TIU.

24. A computer system comprising:
   a central processing unit (CPU);
   a display device coupled to the CPU to display an image;
   a device under test;
   a plurality of relays coupled to the device under test to generate one or more duty cycle control signals, provided to the device under test, by varying one or more voltage values and states of one or more relays receiving the values in order to simulate a potentiometer; and
   a bias-T circuit coupled to the device under test to receive a first output signal and a second output signal of the device under test, the bias-T circuit extracting a first DC portion of the first output signal and a second DC portion of the second output signal and bias-T circuit separating the first DC portion of the first output signal and a radio frequency (RF) of the first output signal.

25. The computer system of claim 24 further including a divider to divide a value of the first DC portion by a sum of the first DC portion and the second DC portion.

26. The computer system of claim 25 wherein a ratio provided by the divider reflects a duty cycle corresponding to the device under test.

27. The computer system of claim 24 wherein the second output signal is complementary to the first output signal of the device under test.

28. The computer system of claim 24 wherein the first output signal is a p channel output signal of the device under test.

29. The computer system of claim 24 further including a main memory coupled to the CPU.

30. The computer system of claim 24 further including a memory coupled to the display device to store the image.

* * * * *